(12) United States Patent
Lee

(10) Patent No.: US 6,963,300 B1
(45) Date of Patent: Nov. 8, 2005

(54) PIPELINE ANALOG-TO-DIGITAL CONVERTER

(75) Inventor: Bumha Lee, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/771,586

(22) Filed: Feb. 4, 2004

(51) Int. Cl.[7] .............................................. H03M 1/12
(52) U.S. Cl. ..................................... 341/172; 341/162
(58) Field of Search ............................... 341/161, 162, 341/172

(56) References Cited

U.S. PATENT DOCUMENTS 5,710,563 A    1/1998   Vu et al. .................... 341/161
6,784,824 B1 *  8/2004   Quinn ........................ 341/172
6,801,151 B1 * 10/2004   Opris ......................... 341/161

\* cited by examiner

*Primary Examiner*—Howard L. Williams
(74) *Attorney, Agent, or Firm*—Brett A. Hertzberg; Merchant & Gould PC

(57) ABSTRACT

DNL and INL errors are minimized in a pipelined converter that is arranged to use reference pre-sampling. An example first stage in the pipelined converter includes a sample/hold amplifier (SHA) circuit, an evaluator circuit, and a multiplying digital-to-analog converter (MDAC) circuit. The evaluator circuit evaluates the input signal in the converter while the SHA circuit samples the input signal. The MDAC samples the SHA output at substantially the same time it samples a reference voltage, where the reference voltage is adjusted in response to the output of the evaluator circuit. Errors due to capacitor mismatching are minimized such that the settling characteristics of the various amplifiers in the circuits dominate the DNL/INL performance.

20 Claims, 10 Drawing Sheets

PIPELINE ANALOG-TO-DIGITAL CONVERTER

FIELD OF THE INVENTION

The present invention is related to the field of analog-to-digital converters. In particular, the present invention is related to a method and apparatus directed to a multi-stage pipeline analog-to-digital converter with reduced differential non-linearity (DNL) and/or integral non-linearity (INL) based conversion errors.

BACKGROUND OF THE INVENTION

An analog-to-digital converter (ADC) is a device that takes an analog data signal and converts it into a digital code, i.e. digitizes or quantizes the analog signal. An ADC is a key building block in mixed-mode integrated circuits (ICs). Once the analog signal is converted into the digital domain, complicated signal processing functions can be performed with easier handling and improved noise immunity. In some instances, power dissipation can be reduced since many ADCs are implemented in a deep submicron CMOS process.

ADCs may employ a wide variety of architectures, such as the integrating, successive-approximation, flash, and the delta-sigma architectures. Recently, the pipelined analog-to-digital converter (ADC) has become a popular ADC architecture for use in high-speed applications such as CCD imaging, ultrasonic medical imaging, digital video, and communication technologies such as cable modems and fast Ethernet. Pipelined ADCs are typically chosen because of their high accuracy, high throughput rates, and low power consumption. Moreover, the pipeline architecture generally provides better performance for a given power and semiconductor die area than other ADC architectures.

An example of a conventional k-stage pipelined ADC (100) is shown in FIG. 1. As shown in the figure, the conventional k-stage pipelined ADC (100) includes an array of k gain stages (102) and a decoder logic circuit (104). Each of the gain stages (102) is connected in series to the previous gain stage (102). Each gain stage (102) is also connected to the decoder logic circuit (104).

In operation, an analog input voltage (Vin) is provided to the first gain stage (102). The first gain stage (102) samples the analog input voltage (Vin) and converts it to a first digital coefficient (n1). The first coefficient (n1) is processed by the decoder logic circuit (104) to provide the Most Significant Bit (MSB) of a digital data representation of the analog input voltage (Vin). The first gain stage (102) also converts the first digital coefficient (n1) back to an analog representation. The analog representation is subtracted from the sampled analog input voltage (Vin) and multiplied by a gain multiplier to provide a residue voltage. The residue voltage (Vres (1)) from the first gain stage (102) becomes the analog input voltage to the next gain stage (102) of the pipeline. That is, Vin (2)=Vres(1). The residue voltage (Vres(i)) continues through the pipeline of gain stages (102), providing another digital coefficient (ni) based on the digital representation of the input to that gain stage, as described above.

The overall digital representation of the analog voltage input (Vin) is obtained by concatenating the k digital coefficients (n1 through nk) from the array of k gain stages (102) through the decoder logic circuit (104). Digital error correction logic is typically used to improve the accuracy of conversion by providing overlap between the quantization ranges of adjacent gain stages (102) in the pipeline. An architecture that makes use of this correction to a 1-bit per stage pipeline ADC is a 1.5-bit per stage pipeline topology.

FIG. 2 is a graph illustrating ideal transfer characteristics of a 1.5-bit per stage conventional pipeline ADC such as illustrated in FIG. 1. In the 1.5-bit architecture, there are two thresholds or transition points in the transfer curve, resulting in three operating regions. Each stage of the 1.5-bit architecture effectively converts only one bit of information. The extra region (as compared to a 1-bit per stage topology) is used for redundancy. That is, the extra bit of information is combined with the digital outputs from subsequent gain stages (102) in the pipeline to generate another bit.

As shown in FIG. 2, the input voltage (Vin) appears along the x-axis and illustrates that the resolvable input range of the ADC is given by: −Vref<Vin <+Vref. Two transition points appear along the x-axis. The first transition point occurs at Vin equal to −Vref/4 and the second transition point occurs at Vin equal to +Vref/4. The two transition points divide the operating range for the input voltage (Vin) into three operating regions, where two bits (00, 01, and 10) of the digital output of each stage characterize the entire range. Further, the slope of each curve reflects the gain multiplier employed in the gain stage (102) of FIG. 1.

Operationally, the gain stage (102) examines the input (Vin (i)) and determines whether the input is less than the first transition point, −Vref/4. If Vin(i) is less than the first transition point (−Vref/4) then the digital code output for the gain stage (102) is 00. Similarly, a digital output code of 01 is generated for Vin(i) between the first transition point, −Vref/4, and the second transition point (+Vref/4). If Vin(i) is greater than the second transition point, +Vref/4, the ideal transfer characteristics generates a digital output code of 10.

Moreover, the output residue voltage (Vres(i)) is generated by the following transfer function:

$$Vres(i)=2M \cdot Vin(i)-Di \cdot Vref \quad (EQ\ 1)$$

where M is the number of effective bits that are being generated by stage i, 2M represents the gain multiplier for the gain stage (102), and Di is a constant determined by the digital representation of the analog input voltage (Vin), having possible values of −1, 0, and 1. For the 1.5-bit per stage ADC, the number of effective bits (M) is one. The output residue voltage (Vres(i)) generated at the ith gain stage (102) becomes the analog input voltage (Vin (i+1)) to the next gain stage (102).

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Figure 1:
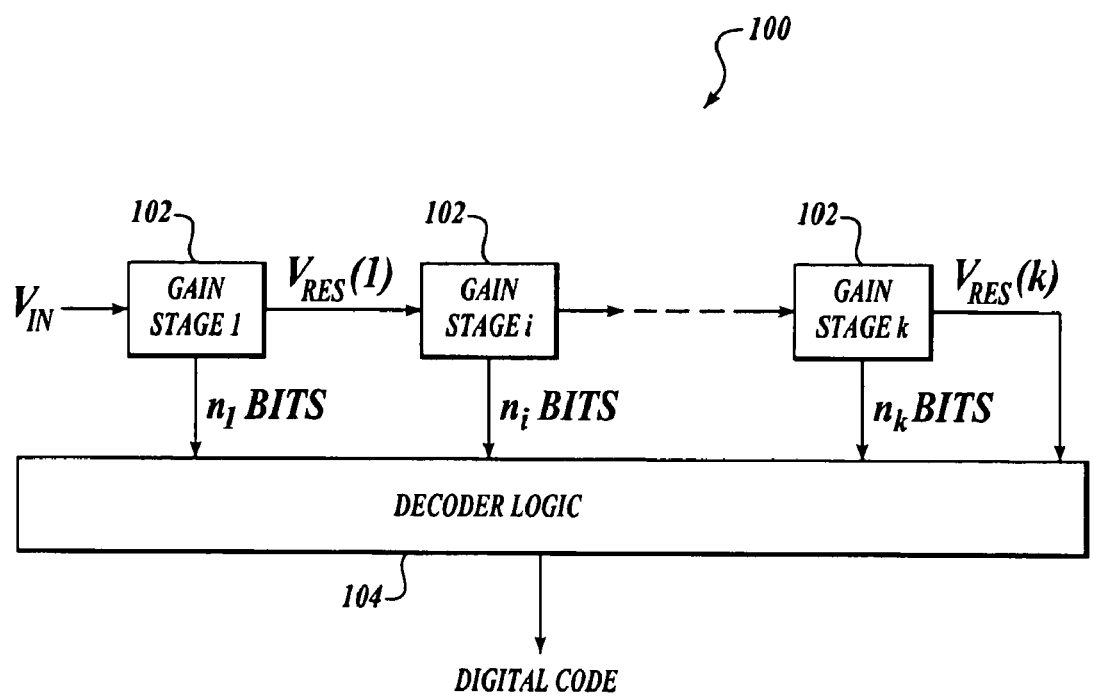
FIG. 1 illustrates a schematic block diagram of a conventional pipelined analog-to-digital converter (ADC)
Figure 2:
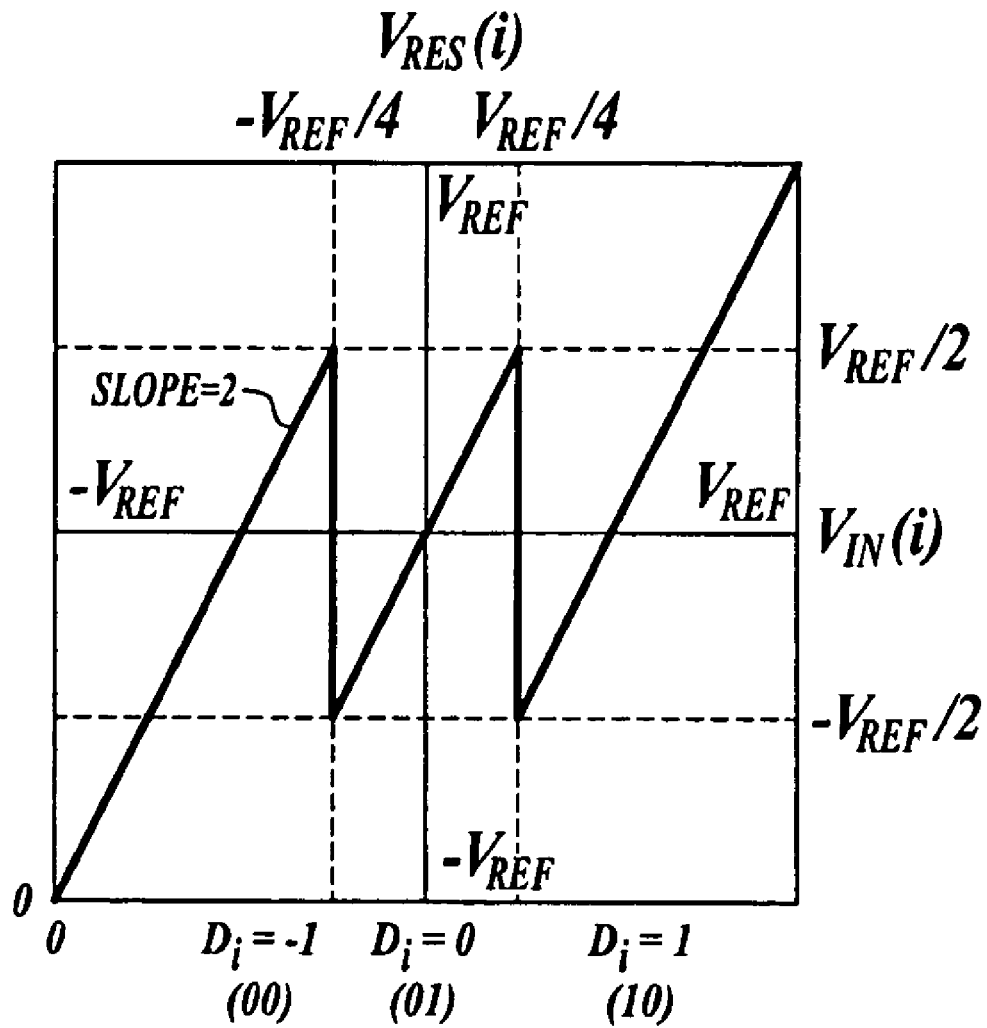
FIG. 2 illustrates a graph of an ideal transfer curve for the conventional pipelined analog-to-digital converter (ADC) of FIG. 1.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, the invention is related to an apparatus and method for a pipelined ADC to minimize DNL and INL error using reference pre-sampling. An example first stage in the pipelined converter includes a sample/hold amplifier (SHA) circuit, an evaluator circuit, and a multiplying digital-to-analog converter (MDAC) circuit. The evaluator circuit evaluates the input signal in the converter while the SHA circuit samples the input signal. The MDAC samples the SHA output at substantially the same time it samples a reference voltage, where the reference voltage is adjusted in response to the output of the evaluator circuit. Errors due to capacitor mismatching are minimized such that the settling characteristics of the various amplifiers in the circuits dominate the DNL/INL performance.

Pipelined ADCs may be implemented with switched capacitor circuit techniques, allowing for easy storage and amplification of analog signals in a CMOS based process. DNL and INL measurements are obtained to determine the linearity characteristics of the ADC by measuring the differences between the actual step widths and a step width for an ideal least significant bit (LSB) of the converter. INL error is defined by the difference between the actual transfer curve of the converter and the ideal transfer curve, and is measured with integrating DNL. An ideal ADC has an analog step size equal to 1-LSB resulting in a DNL and INL of 0-LSB. The resolution of 1-LSB is determined by the full scale voltage range of the converter (VFS) as $VFS/2^N$, where N corresponds to the resolution of the ADC.

The DNL and INL characteristics of an ADC are related to the settling time of the conversion process. For example, the amplifier in the ADC has a finite bandwidth and a finite output drive characteristic (e.g., a maximum current output drive) that directly impacts the settling time in the conversion process. For this example, the amplifier may provide inaccurate conversion results when the output signals of the amplifier have not completely settled. The settling time problem could be resolved with a high DC gain and/or a wide bandwidth amplifier. However, DNL and INL characteristics can be directly related to the capacitor matching due to process related variations. The present invention overcomes the process imperfections with early input signal monitoring and reference pre-sampling such that DNL and INL error is predominately dependent on the amplifier settling performance and not on capacitor matching.

Figure 3:
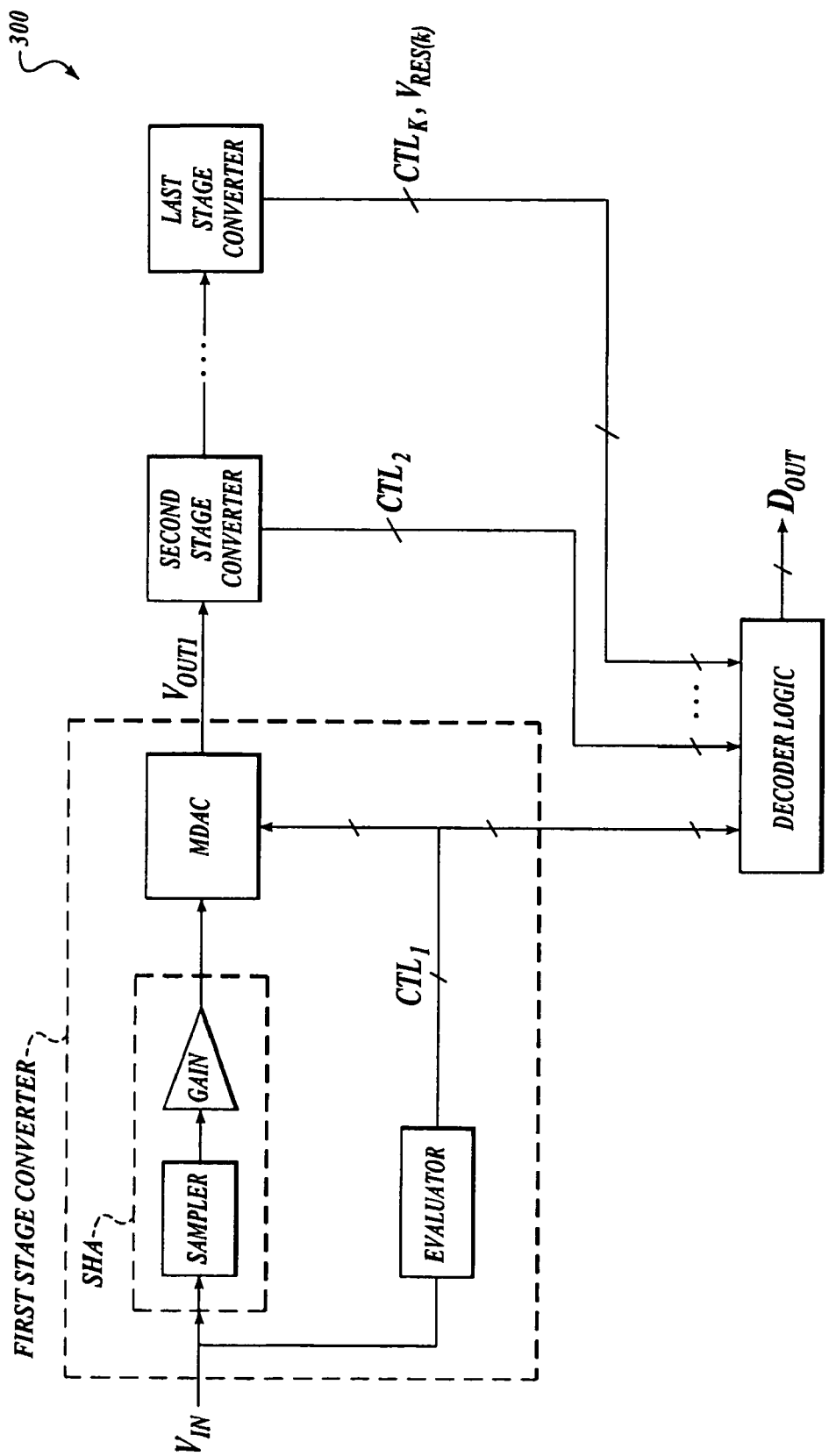
FIG. 3 illustrates an example schematic diagram of an ADC converter system that is arranged in accordance with the present invention.

FIG. 3 illustrates an example schematic diagram of an ADC converter system (300) that is arranged in accordance with the present invention. The ADC converter system (300) includes a first stage converter circuit, subsequent stage converter circuits (second stage through last stage), and a decoder logic circuit. The first stage converter circuit is arranged to receive an analog input signal (VIN) and provide an analog output signal (VOUT1) to the subsequent stage converters. Each of the converter stages (first, second . . . last) are arranged to cooperate with the decoder logic circuit. The decoder logic circuit is arranged to determine the digital output code (DOUT) from the various control signals (CTL1, CTL2 . . . CTLK) for each conversions stage, and from the residue of the last stage of the converter (VRESK).

An example first stage converter includes a sample and hold amplifier (SHA) circuit, a multiplying digital-to-analog converter (MDAC) circuit, and an evaluator circuit. The SHA circuit may be implemented as either separate sampler and gain circuits, or as a circuit where sampling and gain functions are integrated into a single functional block (e.g., switched capacitor SHA). The gain circuit may provide a signal gain that is less than unity, unity, or greater than unity as may be desired in a particular implementation.

A switched capacitor circuit can be arranged to provide the MDAC functions by amplifying an input signal with a DC level (reference voltage) shift. The actual input signal is amplified by the signal transfer factor of the MDAC, which includes capacitors, switching circuits, and an amplifier. The MDAC output is provided within the range of the voltage reference by means of a DC level subtraction or addition. The output conversion of the MDAC is decided by a sub-ADC such as a flash-type converter. Flash-type low resolution ADCs can be used in the pipeline ADC since the sub-ADC offset can be corrected by digital correction logic with an adder array.

The linearity of the MDAC conversion is dependent on: capacitor matching, DC gain of the amplifier in the MDAC, and bandwidth of amplifier in MDAC. DNL characteristics of the MDAC can be improved by utilizing a multi-bit MDAC (e.g., 1.5-bit, 2-bit, 2.5-bit, etc.). The sampling capacitor size of a single-bit MDAC is the same as that for a multi-bit MDAC. The sampling capacitor size is limited by thermal noise levels and/or process dependent capacitor matching characteristics. The total sampling capacitor size ($C_{TOTAL}$) in the MDAC can be determined, to a first order, by the thermal noise level as follows below. C corresponds to a unit capacitor size and $\Delta C_i$ corresponds to the mismatch in the $i^{th}$ sampling capacitor.

$$\text{OUTPUT}_{MDAC} = \frac{C_{TOTAL}}{C + \Delta C_i} \cdot \text{INPUT} \quad \text{(Eq. 1)}$$

$$\text{OUTPUT}_{MDAC} = \frac{C_{TOTAL}}{C + \Delta C_i} \cdot \frac{C}{C_{TOTAL}} \quad \text{(Eq. 2)}$$

$$= \frac{1}{\left(1 + \frac{\Delta C_i}{C_i}\right)} \approx 1 - \frac{\Delta C_i}{C_i}$$

The input equivalent error ($\text{ERROR}_{INPUT}$) is related to the bit resolution (m) of the MDAC, the unit capacitor size (C), and the mismatching of the $i^{th}$ sampling capacitor ($\Delta C_i$):

$$\text{ERROR}_{INPUT} = \frac{\Delta C_i}{C} \cdot \frac{1}{2^m} \quad \text{(Eq. 3)}$$

The DNL error of the $1^{st}$ stage MDAC is determined by the input equivalent error ($\text{ERROR}_{INPUT}$) and the amplification factor of the MDAC ($2^N$, where N corresponds to the number of bits of resolution in the ADC system) as:

$$DNL = \frac{\Delta C_i}{C} \cdot \frac{1}{2^m} \cdot 2^N \quad \text{(Eq. 4)}$$

The total size of the sampling capacitor ($C_{TOTAL}$) can be fixed for lower power dissipation based on the thermal noise level as:

$$C = \frac{C_{TOTAL}}{2^m} \quad \text{(Eq. 5)}$$

Matching error in the capacitors ($\Delta C_i$) is dependent on the unit sampling capacitor size (C) and a process related matching coefficient (k) as:

$$\Delta C_i = k \cdot \sqrt{C} \quad \text{(Eq. 6)}$$

The DNL error is determined by substituting Eq. 5 and Eq. 6 into Eq. 4, such that:

$$DNL = k \cdot \frac{1}{\sqrt{C_{TOTAL}}} \cdot 2^{N-\frac{m}{2}} \quad \text{(Eq. 7)}$$

The DNL error is improved by a factor of $\sqrt{2}$ with every extra bit of resolution in each stage of the pipelined converter.

Although multiple bits are preferred for each stage of the pipelined converter to reduce DNL error, higher operating frequencies require higher speed amplifiers in each stage. The higher operating frequency of the amplifier results in higher power dissipation which may be unacceptable in certain applications. As such, 1.5 bits per stage may be preferable in the ADC to limit power dissipation, reduce amplifier requirements and to minimize DNL error.

DNL error can be further reduced by using a capacitor swapping technique in the 1.5 bit stage. Two sampling capacitors (e.g., C1 and C2) and an amplifier can be arranged to operate as part of a 1.5 bit-per-stage MDAC. During the sampling phase, the top plates of both capacitors are coupled to the positive input node of the amplifier, while the bottom plates of both capacitors are coupled to the input signal. The top plates are also coupled to a ground signal in the sampling phase such that the input signal is stored on the capacitors. During the amplification phase, the bottom plate of one capacitor (e.g., C1) is connected to the amplifier output, while the bottom plate of the other capacitor (e.g., C2) is connected to a reference voltage level. A 1.5-bit sub ADC (e.g., two comparators) evaluates the sampled input signal to perform 1.5 bit analog-to-digital conversion. The comparison points for the 1.5-bit sub ADC is, for example, $-\frac{1}{4}$ and $+\frac{1}{4}$ of a reference voltage level for the 1.5-bit sub ADC. The reference voltage levels for the MDAC correspond to, for example, $-1V$, $0V$, and $+1V$ based on the 1.5-bit sub ADC conversion, and are utilized to maximize the correction range for comparator offsets via the digital correction logic.

During the amplification phase, one of the capacitors (e.g., C1) is used as sampling capacitor while the other capacitor (e.g., C2) is used as feedback capacitor. The selection of the sampling capacitor and the feedback capacitor is determined by the input signal level as evaluated during the sampling phase. In one example, the input signal level is evaluated as less than $\frac{1}{4}$ of the reference voltage level and capacitor C1 is used as the feedback capacitor while capacitor C2 is used as the sampling capacitor. In another example, the input signal is evaluated as between the range of $+\frac{1}{4}$ and $-\frac{1}{4}$ of the reference voltage level and capacitor C2 is used as the feedback capacitor while capacitor C1 is used as the sampling capacitor. In still another example, the input signal level is evaluated as greater than $\frac{1}{4}$ of the reference voltage level and capacitor C1 is used as the feedback capacitor while capacitor C2 is used as the sampling capacitor. The output voltage ($V_{OUT}$) for the MDAC is determined by the input signal level ($V_{IN}$) as follows:

For VIN $<-\frac{1}{4} \cdot$VREF, $$V_{OUT} = \left(1 + \frac{C_2}{C_1}\right) \cdot V_{IN} + \frac{C_2}{C_1} \quad \text{(Eq. 8)}$$

For $-\frac{1}{4}$ VREF$<$VIN $<+\frac{1}{4} \cdot$VREF, $$V_{OUT} = \left(1 + \frac{C_1}{C_2}\right) \cdot V_{IN} \quad \text{(Eq. 9)}$$

For VIN $>+\frac{1}{4} \cdot$VREF, $$V_{OUT} = \left(1 + \frac{C_2}{C_1}\right) \cdot V_{IN} - \frac{C_2}{C_1} \quad \text{(Eq. 10)}$$

The DNL error of 1.5 bit MDAC without the capacitor swapping caused by the capacitor mismatch is $2 \cdot \alpha$, where the sampling capacitor ($C_S$) is given as $C_S = C_1$, $= C \cdot (1+\alpha)$, the feedback capacitor ($C_F$) is given by $C_F = C_2 = C \cdot (1-\alpha)$, and $\alpha$ corresponds to the capacitor mismatching coefficient. However, the DNL error with the capacitor swapping is improved by 2 times and $\alpha$. Although the multi-bit stage ADC theoretically has better DNL and INL performance, the 1.5-bit per-stage ADC may be preferable since it has the advantages of: high speed operation, lower power dissipation, and can have improved DNL performance with the addition of the above described capacitor swapping technique.

Although DNL performance can be improved using the capacitor swapping techniques, the DNL performance is highly dependent on capacitor matching. Capacitor mismatches may result in the ADC performance having missing codes and/or be non-monotonic. Additionally, INL performance does not necessarily improve in ADCs that utilize the capacitor swapping technique. The lack of improvement in the INL performance is predominantly a result of the signal transfer curves being different at the tripping points because the capacitor swapping technique changes the ADC transfer curves based on the input signal level to reduce DNL error.

In the previously described 1.5-bit MDAC, the imperfect capacitor matching causes transfer curve errors as well as dropping voltage error around the transfer curve trip points. However, the non-ideal transfer curve of the MDAC in the first stage does not contribute to DNL related errors since the DNL errors relate to the dropping voltage errors around the transfer curve trip points. Thus, there is relatively insignificant INL errors due to capacitor mismatches even if the dropping voltages around the trip points are the same as the ideal dropping voltage.

The dropping voltage is related to the sampling capacitor ($C_S$), the feedback capacitor ($C_F$), and the reference voltage level ($V_{REF}$) as $(C_S/C_F) \cdot V_{REF}$. By sampling the reference voltage level ($V_{REF}$) with the feedback capacitor ($C_F$), the dependency for the dropping voltage on capacitor matching can be reduced.

Figure 4:
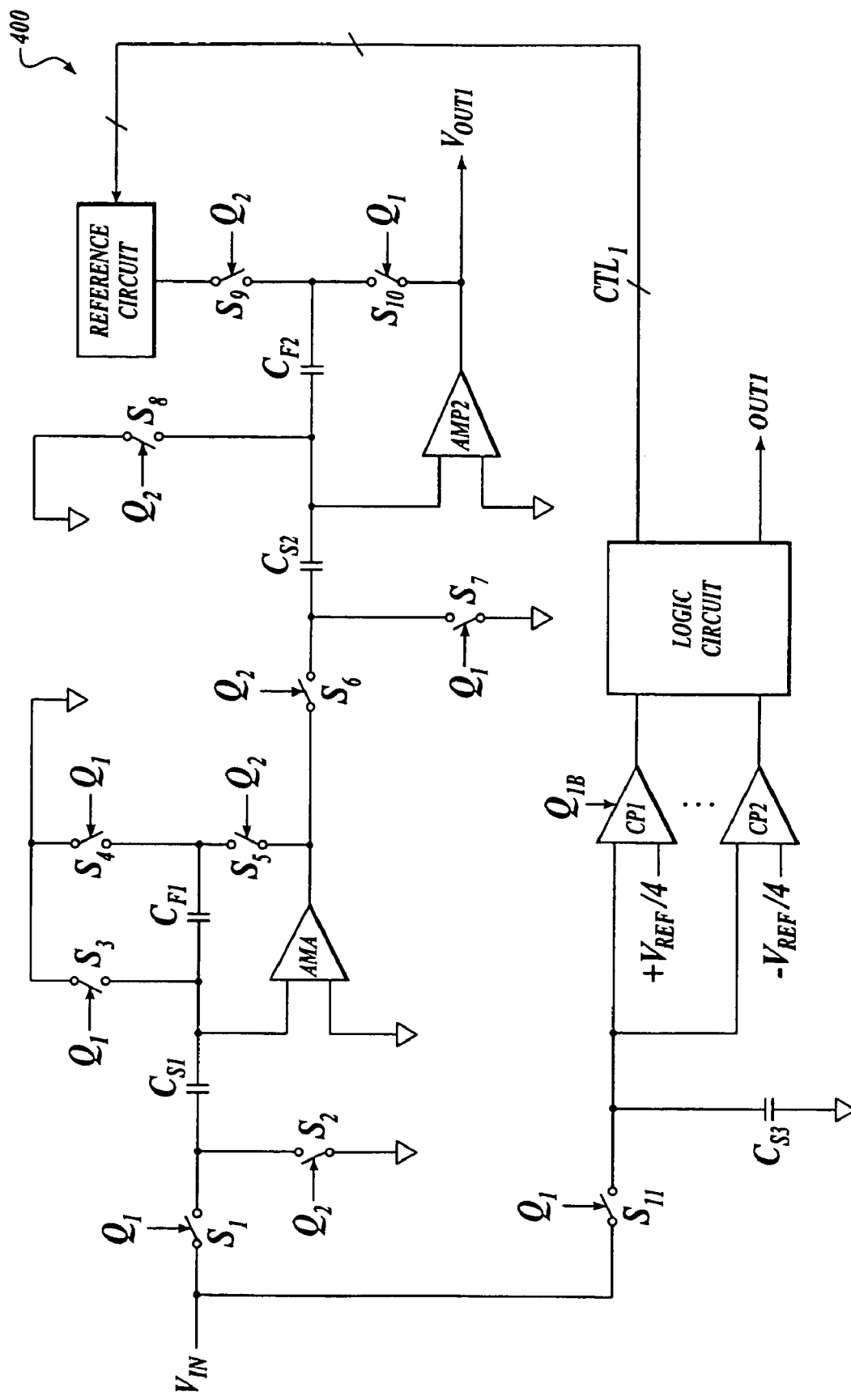
FIG. 4 illustrates a schematic diagram for a first stage converter circuit that is arranged in accordance with the present invention.
Figure 5:
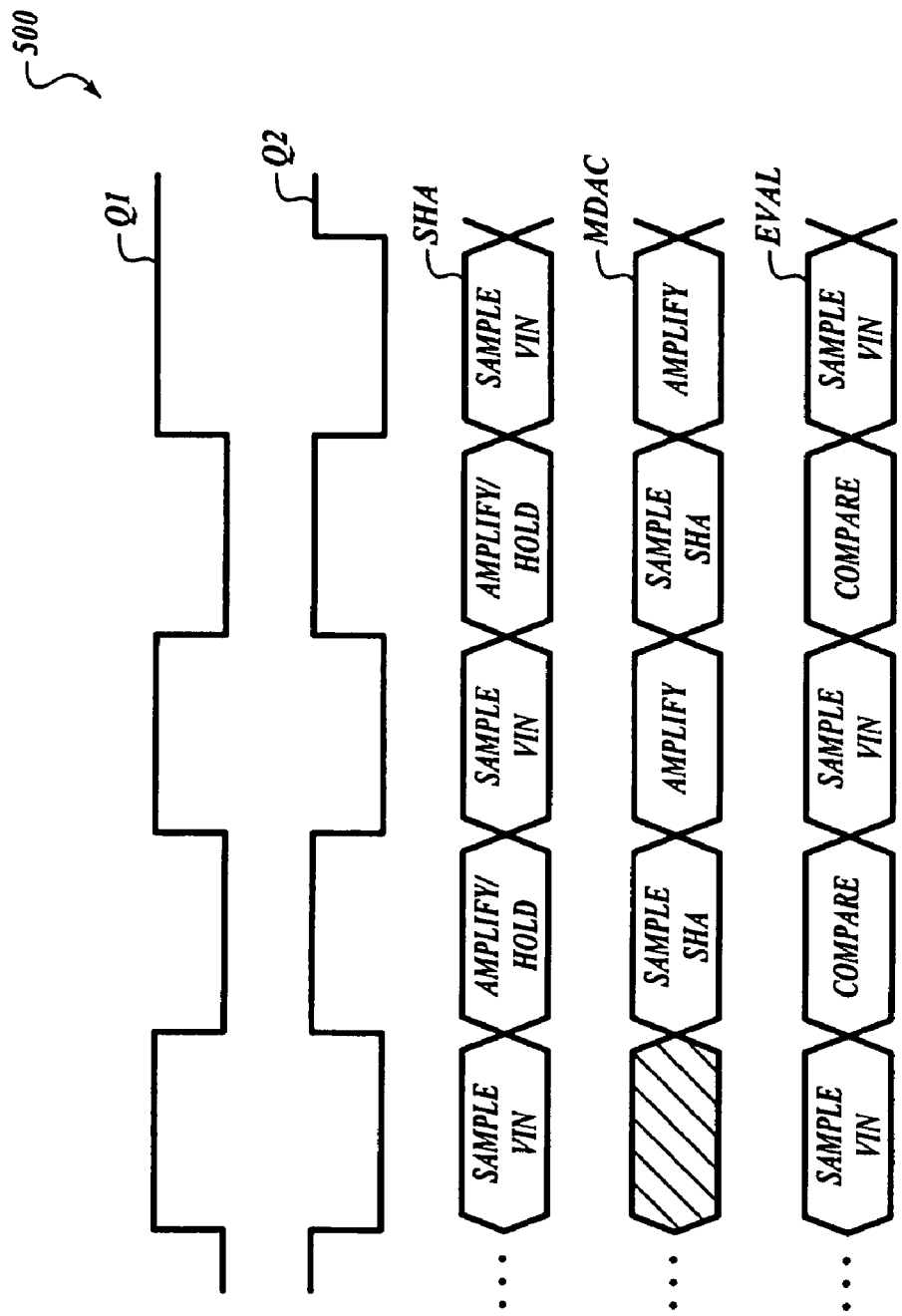
FIG. 5 illustrates the timing of various operational phases for the first stage converter circuit illustrated in FIG. 4.

FIG. 4 illustrates a schematic diagram for a first stage converter (400) circuit that is arranged in accordance with the present invention. FIG. 4 includes the functional blocks of the first stage converter that was described with respect to FIG. 3. The example first stage converter circuit (400) includes a sample-and-hold amplifier (SHA) circuit, a multiplying digital-to-analog converter (MDAC) circuit, and an evaluator circuit. An example of the timing related to various signals and functions are illustrated in FIG. 5.

The SHA circuit includes an amplifier circuit ($AMP_1$), two capacitor circuits ($C_{S1}$, $C_{F1}$), and five switching circuits ($S_1$–$S_5$). Switching circuits $S_1$, $S_3$, and $S_4$ are responsive to signal $Q_1$, while switching circuit $S_2$ and $S_5$ are responsive to signal $Q_2$. The SHA circuit is responsive to signals $Q_1$ and $Q_2$, which define the operating phases for the sample and hold/amplification modes of the SHA circuit. While signal $Q_1$ is asserted: Capacitor $C_{F1}$ is reset to an initial condition (e.g., 0V) and capacitor $C_{S1}$ is arranged to sample the input signal ($V_{IN}$) via switching circuits $S_1$, $S_3$, and $S_4$. Capacitor $C_{S1}$ is arranged to cooperate with capacitor $C_{F1}$ and switching circuits $S_2$ and $S_5$ such that amplifier $AMP_1$ redistributes the stored charge from capacitor $C_{S1}$ when signal $Q_2$ is asserted.

Figure 8:
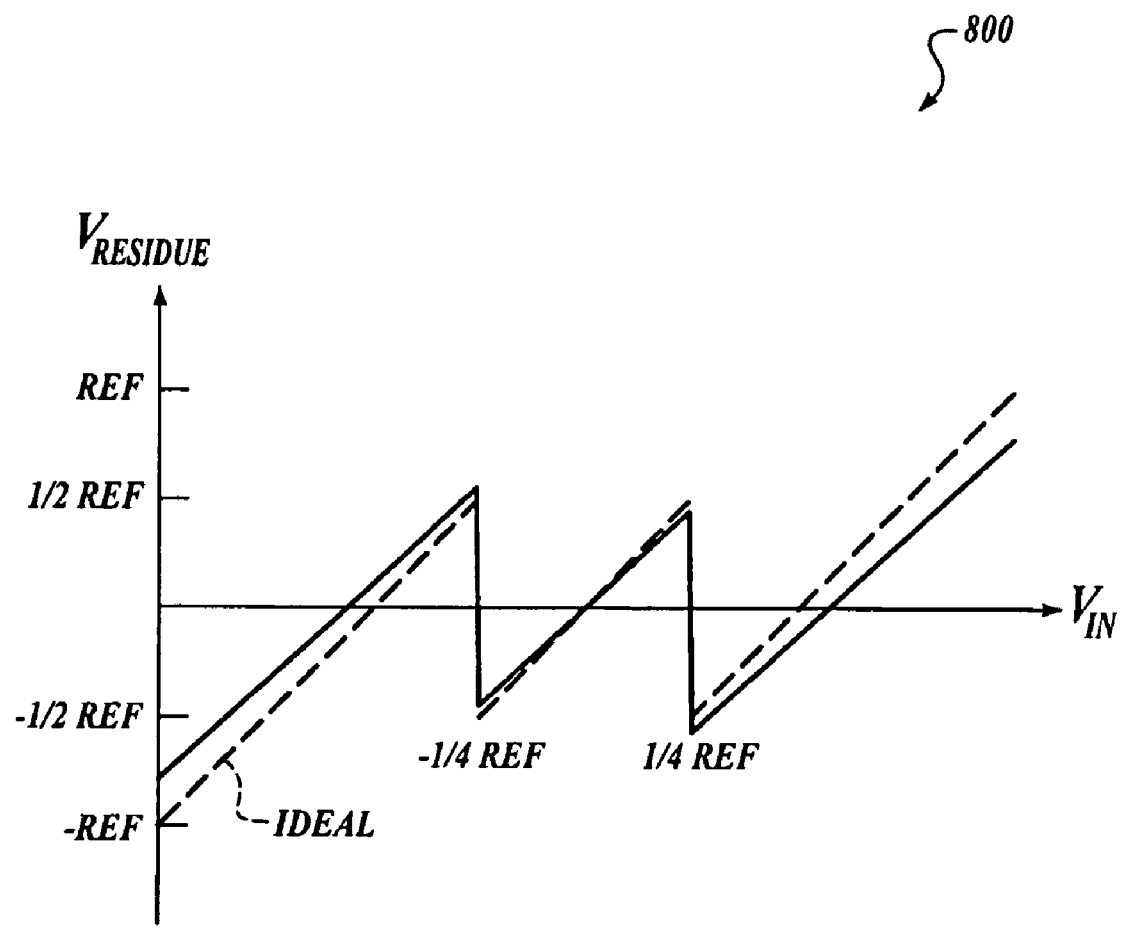
FIGS. 8–10 illustrate various performance merits of a pipelined converter circuit that is arranged in accordance with the present invention.
Figure 9:
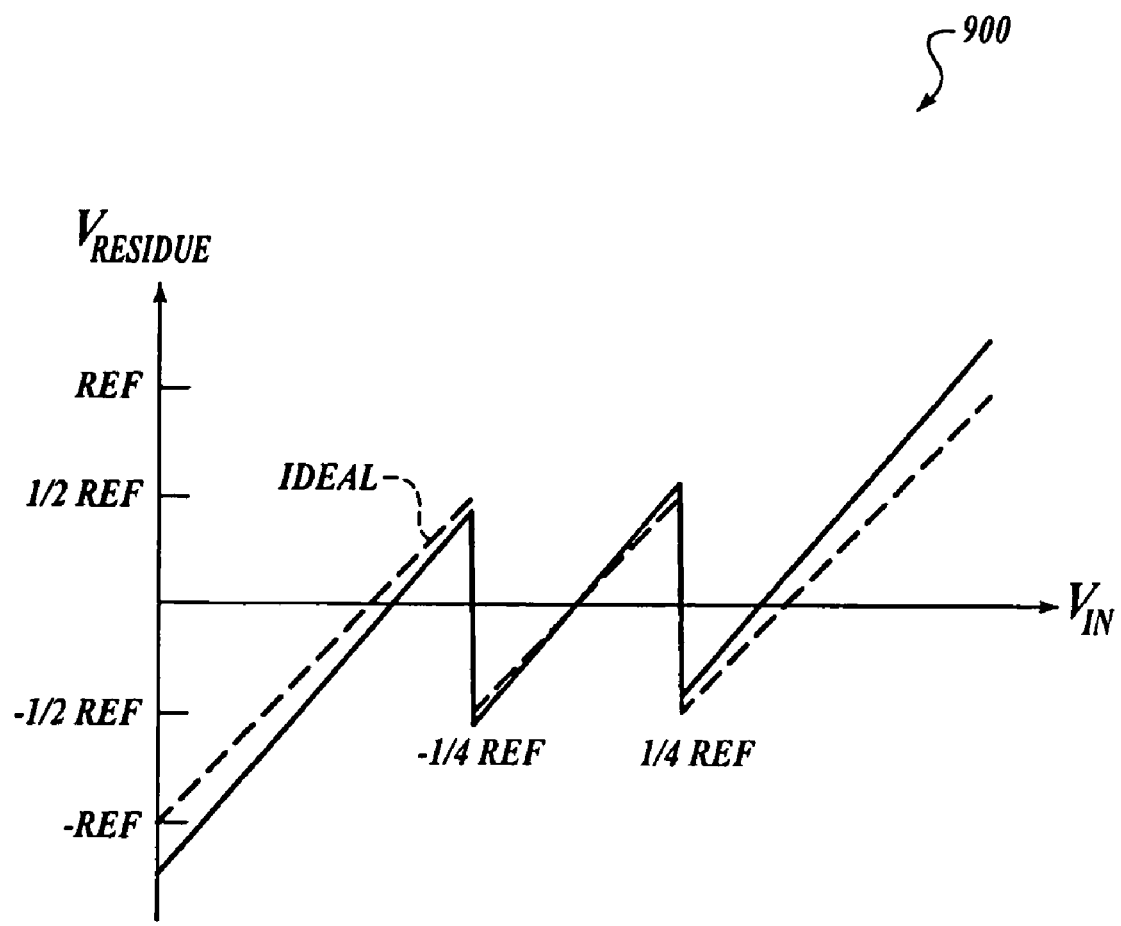

The MDAC circuit includes an amplifier circuit ($AMP_2$), two capacitor circuits ($C_{S2}$, $C_{F2}$), and five switching circuits ($S_6$–$S_{10}$). Switching circuits $S_7$ and $S_{10}$ are responsive to signal $Q_1$, while switching circuit $S_6$, $S_8$, and $S_9$ are responsive to signal $Q_2$. The MDAC circuit is responsive to signals $Q_1$ and $Q_2$, which define the operating phases for the MDAC circuit. While signal $Q_2$ is asserted: Capacitor $C_{F2}$ is reset to known condition (e.g., a selected reference voltage level) via switching circuits $S_8$ and $S_9$, and capacitor $C_{S2}$ is arranged to receive the sampled signal (e.g., $V_{SHA}$) via switching circuit $S_6$. Capacitor $C_{S2}$ is arranged to cooperate with capacitor $C_{F2}$ and switching circuits $S_7$ and $S_{10}$ such that amplifier $AMP_2$ redistributes the stored charges from capacitors $C_{F2}$ and $C_{S2}$ when signal $Q_1$ is asserted. The resulting signal output of the MDAC circuit corresponds to $VOUT_1$ as illustrated in FIGS. 8 and 9.

The evaluator circuit includes two comparators ($CP_1$ and $CP_2$), a capacitor ($C_{S3}$), a switching circuit ($S_{11}$), and a logic circuit. Switching circuit $S_{11}$ is responsive to signal $Q_1$, while comparator circuits $CP_1$ and $CP_2$ are responsive to signal $Q_{1B}$, which define the operating phases for the evaluator circuit. Capacitor $C_{S3}$ is arranged to cooperate with switching circuit $S_{11}$ such that the input signal ($V_{IN}$) is sampled by capacitor $C_{S3}$ while signal $Q_1$ is asserted. Signal $Q_{1B}$ is asserted after switching circuit $S_{11}$ decouples capacitor $C_{S3}$ from the input signal ($V_{IN}$). Comparator circuits $CP_1$ and $CP_2$ are arranged to compare the sampled signal from capacitor $C_{S3}$ to reference voltage levels when signal Q1B is asserted. The reference voltage level for comparator $CP_1$ corresponds to $+\frac{1}{4}$ of a predetermined reference voltage level, while the reference voltage level for comparator $CP_2$ corresponds to $-\frac{1}{4}$ of the predetermined reference voltage level. The logic circuit is arranged to evaluate the output of the comparators ($CP_1$ and $CP_2$) and provide digital output signals (e.g., $CLT_1$, $OUT_1$). In one example, the digital output signals correspond to multi-bit signals that are utilized by decoder logic (see FIG. 3).

The functions of the comparator circuits ($CP_1$ and $CP_2$) and the logic circuits in the evaluator circuit can be combined into a single functional block.

Moreover, a single comparator circuit can be used with a time based multiplexing circuit to accomplish the same functions of comparator circuits $CP_1$ and $CP_2$.

A reference circuit can be arranged to provide the reference level that is utilized by the MDAC. The reference circuit is responsive to at least one of the outputs of the evaluator circuit (e.g., $CTL_1$), which may correspond to one or more control bits. The reference circuit may also be arranged to provide the reference levels that are utilized by the comparator circuits in the evaluator circuit.

The example circuit illustrated in FIG. 4 can be used in a 1.5-bit 1st stage of a pipelined ADC. The circuit is arranged to provide reference pre-sampling in the MDAC circuit as will be described with reference to FIG. 4 and FIG. 5. The SHA circuit provides sample and hold functions with respect to the analog input signal ($V_{IN}$) to improve the dynamic performance of the converter. The evaluator circuit is arranged to operate as a 1.5-bit flash ADC. In one example, the sampling capacitor ($C_{S2}$) in the MDAC circuit is approximately two times bigger than the feedback capacitor ($C_{F2}$) such that the signal transfer gain in the MDAC circuit has a gain of roughly two.

Figure 6:
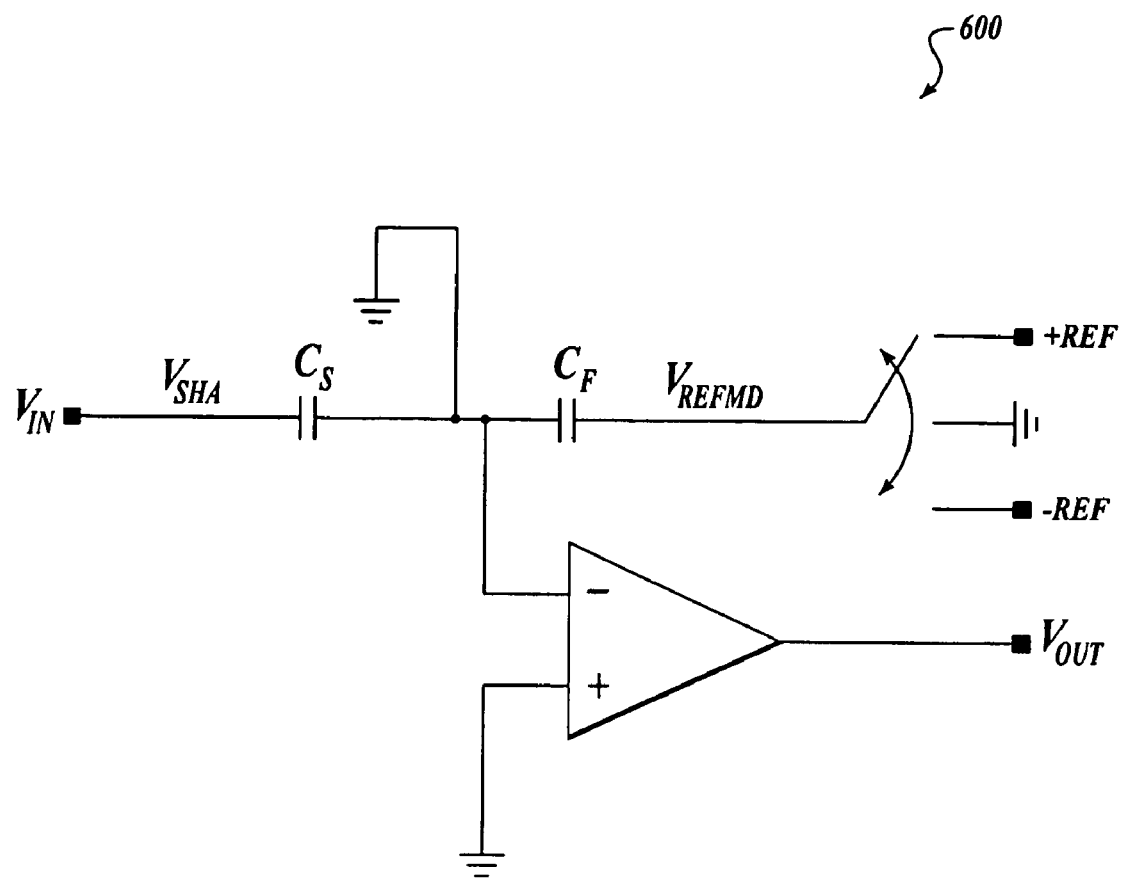
FIG. 6 illustrates a simplified diagram of an example MDAC circuit that is arranged in accordance with the present invention, while operated during a sampling phase.
Figure 7:
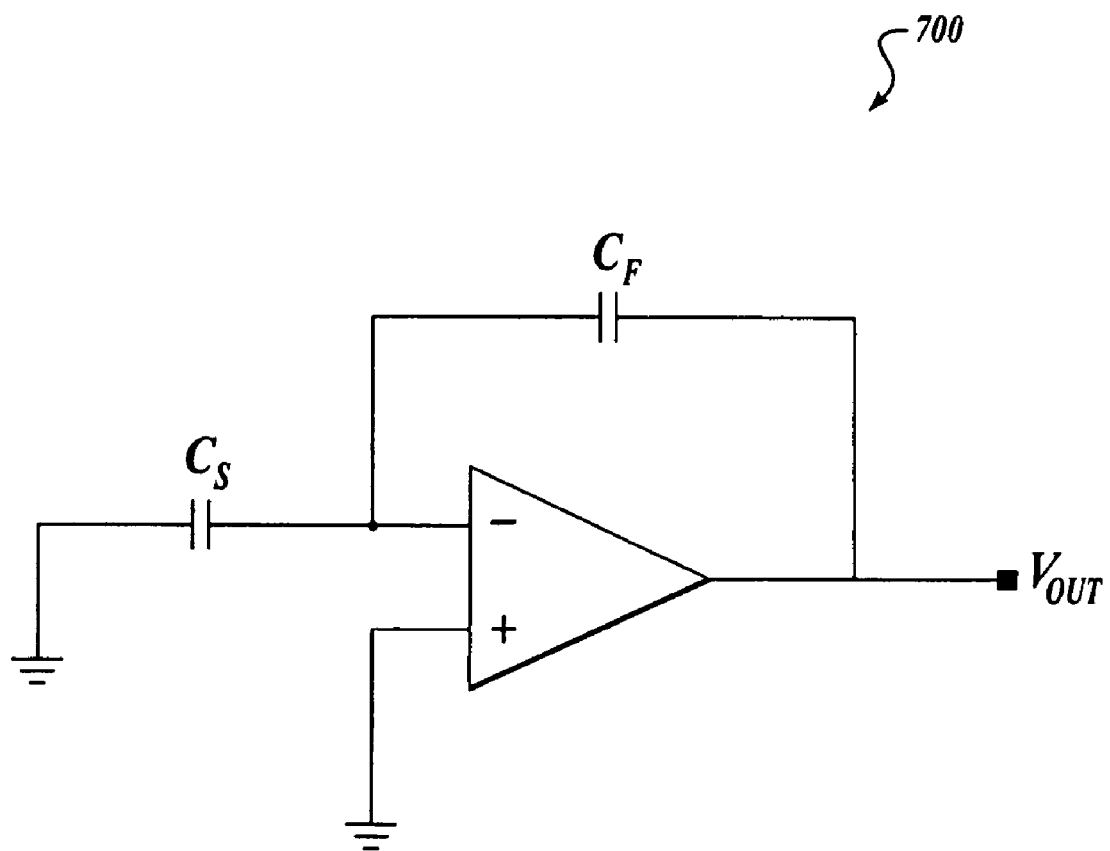
FIG. 7 illustrates a simplified diagram of an example MDAC circuit that is arranged in accordance with the present invention, while operated during an amplification phase.

The operation of a conversion cycle for the circuit illustrated in FIG. 4 will be described below with reference to the signal waveforms illustrated in FIG. 5. FIG. 6 illustrates a simplified diagram of an example MDAC circuit during a sampling phase, while FIG. 7 illustrates a simplified operational diagram of the example MDAC circuit during an amplification phase.

The input signal ($V_{IN}$) is sampled on the sampling capacitor ($C_{S1}$) in the SHA circuit during the sampling phase which is initiated by signal $Q_1$. The input signal ($V_{IN}$) is also sampled on the input sampling capacitor ($C_{S3}$) of evaluator circuit. The evaluator circuit compares the input signal level to the reference levels (e.g., VREF/4, −VREF/4) and provides a digital output code (e.g., CTL1, OUT1) at the beginning of the amplification phase which is initiated by signal $Q_2$.

The reference voltage for the MDAC circuit is adjusted in response to at least one of the digital output codes from the evaluator circuit. For the example illustrated in FIG. 6, the reference voltages are selected from the set of: +REF, 0V, and −REF in response to the evaluator circuit output. As illustrated in FIG. 6, the reference voltage for the MDAC circuit ($V_{REFMD}$) and the output of the SHA circuit ($V_{SHA}$) are sampled while signal $Q_2$ is asserted (the amplification phase), where the feedback capacitor (e.g., $C_{F2}$ from FIG. 4) samples $V_{REFMD}$ and the sampling capacitor (e.g., $C_{S2}$ from FIG. 4) samples $V_{SHA}$. During the amplification phase, the sampled signals ($V_{SHA}$ and $V_{REFMD}$) are amplified as illustrated in FIG. 7.

The input signal ($V_{IN}$) is monitored a half clock cycle in advance as compared to conventional methods such that an appropriate reference voltage ($V_{REFMD}$) can be determined for the MDAC circuit (via the evaluator circuit) prior to sampling the output of the SHA circuit ($V_{SHA}$). Since the SHA circuit is operated with a half clock latency, the MDAC reference voltage can be pre-sampled on the feedback capacitor ($C_{F2}$) during the sampling of the SHA circuit output. The input sampling signal can amplified by a factor of two during the next sampling phase (signal $Q_1$) and the dropping voltage corresponds to the pre-sampled reference voltage.

Since $V_{REFMD}$ is not fed into the sampling capacitor ($C_{S2}$), the dropping voltages of MDAC circuit at the tripping points are substantially independent of capacitor matching between the sampling capacitor ($C_{S2}$) and the feedback capacitor ($C_{F2}$). The resulting voltage drops at the tripping points are approximately equal (e.g., 1 V when +VREF and VREF are =1 V and 1 V, respectively). Since no capacitor swapping is utilized, the signal transfer gains are approximately the same over the input range. Although variations in capacitor matching performance will result in transfer gain error, the transfer gain error does not deteriorate INL and DNL performance. Mathematically, the transfer function resulting from the operation of the MDAC circuit described herein can be expressed as follows below.

For VIN <−¼·VREF, $$V_{OUT} = \left(1 + \frac{C_S}{C_F}\right) \cdot V_{IN} + 1 \quad \text{(Eq. 11)}$$

For −¼·VREF<VIN <+¼·VREF, $$V_{OUT} = \left(\frac{C_S}{C_F}\right) \cdot V_{IN} \quad \text{(Eq. 12)}$$

For VIN >+¼·VREF, $$V_{OUT} = \left(\frac{C_S}{C_F}\right) \cdot V_{IN} - 1 \quad \text{(Eq. 13)}$$

Figure 10:
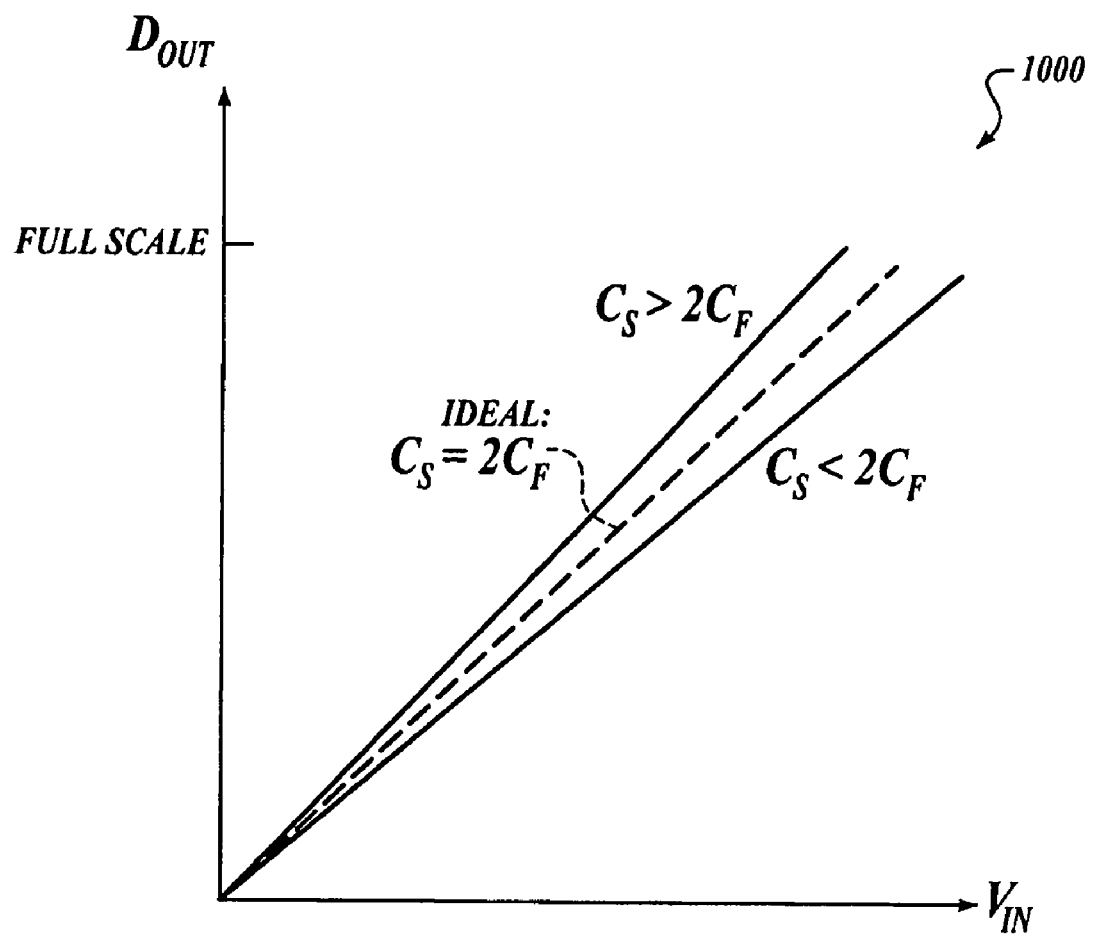

Various performance merits of a pipelined converter circuit that is arranged in accordance with the present invention are illustrated in FIGS. 8–10.

FIG. 8 illustrates a residue voltage transfer curve for a non-ideal pipelined converter circuit that has a sampling capacitor ($C_S$) that is large relative to the feedback capacitor ($C_F$). The slope of the ideal transfer curve is noted by a dotted line in FIG. 8. The slope for the non-ideal pipelined converter does not change over the input range and the voltage drops at the tripping points in the transfer curve are approximately equal to one another. Since the slope is greater than two times, the input signal is amplified.

FIG. 9 illustrates a residue voltage transfer curve for a non-ideal pipelined converter circuit that has a sampling capacitor ($C_S$) that is small relative to the feedback capacitor ($C_F$). The slope of the ideal transfer curve is also noted by a dotted line in FIG. 9. The slope for the non-ideal pipelined converter does not change over the input range and the voltage drops at the tripping points in the transfer curve are approximately equal to one another. Since the slope is less than two times, the input signal is attenuated.

FIG. 10 illustrates the conversion code transfer functions for ideal and non-ideal pipelined converters. The ideal transfer curve is illustrated as a dotted line. The non-ideal transfer curves for $C_S>2 \cdot C_F$ and $C_S<2 \cdot C_F$ illustrate a slope change in the transfer curves due to the non-ideal effects of mismatched capacitors.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for producing digital output signals from an analog input signal in a pipelined converter, the apparatus comprising:
   a sample-and-hold amplifier (SHA) circuit that includes an SHA input terminal that is coupled to the analog input signal and an SHA output terminal, wherein the SHA circuit is arranged to provide a sampled voltage ($V_{SHA}$) that is responsive to the analog input signal;
   an evaluator circuit that includes an evaluation input terminal that is coupled to the analog input signal ($V_{IN}$) and a digital output terminal that is arranged to provide digital codes that are responsive to the analog input signal;
   a reference circuit that includes an adjustment input terminal that is coupled to the digital output terminal, and a reference output terminal, wherein the reference circuit is arranged to provide a reference voltage ($V_{REF}$) that is responsive to at least one of the digital codes; and
   a multiplying digital-to-analog converter (MDAC) circuit that includes an MDAC input terminal that is coupled to the SHA output terminal, an MDAC output terminal that is arranged to provide an output voltage ($V_{OUT1}$), and a reference input terminal ($V_{REFMD}$) that is arranged receive the reference voltage ($V_{REF}$), wherein the MDAC circuit is arranged to sample the reference voltage ($V_{REF}$) and the sampled voltage ($V_{SHA}$) at substantially the same time.

2. The apparatus of claim 1, the sample-and-hold amplifier (SHA) circuit comprising a sampling circuit and a sampler block that is arranged to cooperate with a gain block.

3. The apparatus of claim 2, wherein the gain block has a gain of 1.

4. The apparatus of claim 1, the sample-and-hold amplifier (SHA) circuit comprising a sampling capacitor circuit, a feedback capacitor circuit, and an amplifier circuit, wherein the sampling capacitor is arranged to sample the analog input signal during a first operating phase, and wherein the sampling capacitor, the feedback capacitor, and the amplifier circuit are arranged to provide the sampled voltage ($V_{SHA}$)

during a second operating phase, wherein the sampled voltage ($V_{SHA}$) is related to the analog input signal ($V_{IN}$) by a gain factor.

5. The apparatus of claim 4, the sample-and-hold amplifier (SHA) wherein the sampling capacitor circuit, the feedback capacitor circuit, and the amplifier circuit are arranged to cooperate with one another such that: the sampling capacitor circuit is coupled to the analog input signal during the first operating phase, the feedback capacitor is initialized during the first operating phase, the sampling capacitor is decoupled from the analog input signal during the second operating phase, and the amplifier is arranged to redistribute the charges between the sampling capacitor and the feedback capacitor during the second operating phase.

6. The apparatus of claim 1, wherein the evaluator circuit comprises a flash-type converter.

7. The apparatus of claim 1, wherein the evaluator circuit comprises a 1.5-bit sub-ADC.

8. The apparatus of claim 1, wherein the evaluator circuit comprises a sampling capacitor, a comparator circuit, and a digital logic circuit that are arranged to cooperate with one another such that: the sampling capacitor samples the analog input signal during a first operating phase to provide a sampled signal, the comparator circuit evaluates the sampled signal after the first operating phase to provide at least one evaluation signal, and the digital logic circuit provides the digital code in response to the at least one evaluation signal.

9. The apparatus of claim 1, wherein the evaluator circuit comprises a sampling capacitor, a first comparator circuit, a second comparator circuit, and a digital logic circuit that are arranged to cooperate with one another such that: the sampling capacitor samples the analog input signal during a first operating phase to provide a sampled signal, the first comparator circuit evaluates the sampled signal after the first operating phase to provide at first evaluation signal, the second comparator circuit evaluates the sampled signal after the first operating phase to provide a second evaluation signal, and the digital logic circuit provides the digital code in response to the first and second evaluation signals.

10. The apparatus of claim 9, wherein the first and second comparator circuits are arranged to compare the sampled signal to $+V_{REF}/4$ and $-V_{REF}/4$, respectively.

11. The apparatus of claim 10, wherein the reference circuit further arranged such that: $V_{REFMD}$ corresponds to $-V_{REF}$ when the sampled signal is greater than $+V_{REF}/4$, $V_{REFMD}$ corresponds to $+V_{REF}$ when the sampled signal is less than $-V_{REF}/4$, and $V_{REFMD}$ corresponds to 0V when the sampled signal is between $-V_{REF}/4$ and $+V_{REF}/4$.

12. The apparatus of claim 1, the multiplying digital-to-analog converter (MDAC) circuit comprising: a sampling capacitor circuit ($C_S$), a feedback capacitor circuit ($C_F$), and an amplifier circuit are arranged to cooperate with one another such that: the sampling capacitor samples the sampled voltage ($V_{SHA}$) during a second operating phase, the feedback capacitor samples the MDAC reference voltage ($V_{REFMD}$) during the second operating phase, and the sampling capacitor, the feedback capacitor, and the amplifier circuit provide the output voltage ($V_{OUT1}$) during a first operating phase, wherein the sampled voltage ($V_{SHA}$) is related to the output voltage ($V_{OUT1}$) according to a transfer function.

13. The apparatus of claim 12, wherein the transfer function comprises:

$$V_{OUT1} = \left(1 + \frac{C_S}{C_F}\right) \cdot V_{SHA} + 1,$$

when $V_{IN}$ is evaluated as less than a first predetermined threshold;

$$V_{OUT1} = \left(1 + \frac{C_S}{C_F}\right) \cdot V_{SHA},$$

when $V_{IN}$ is evaluated as greater than a second predetermined threshold; and $$V_{OUT1} = \left(\frac{C_S}{C_F}\right) \cdot V_{SHA},$$

when $V_{IN}$ is evaluated as between the first and second predetermined thresholds.

14. The apparatus of claim 1, wherein the apparatus is arranged such that the sampled voltage ($V_{SHA}$) is sampled by the SHA circuit during a first operating phase, the analog input signal (VIN) is evaluated by the evaluator circuit prior to a second operating phase such that the reference circuit selects the reference voltage ($V_{REF}$) prior to the second operating phase, wherein the MDAC circuit is further arranged to: sample the sampled voltage ($V_{SHA}$) during the second operating phase, sample the selected reference voltage ($V_{REF}$) during the second operating phase, and adjust the output voltage during the first operating phase.

15. An apparatus for producing digital output signals from an analog input signal in a pipeline converter, the apparatus comprising:
    a sample-and-hold amplifier means that is arranged to provide a sampled voltage ($V_{SHA}$) that is responsive to the analog input signal ($V_{IN}$);
    an evaluator means that is arranged to provide digital codes that are responsive to the analog input signal ($V_{IN}$);
    a reference means that is arranged to provide a selected reference voltage ($V_{REF}$) that is responsive to at least one of the digital codes from the evaluator means; and
    a multiplying digital-to-analog converter (MDAC) means that is arranged to sample the selected reference voltage ($V_{REF}$) and the sampled voltage ($V_{SHA}$) at substantially the same time, and also arranged to provide an output voltage ($V_{OUT1}$) that is associated with a residue signal of the pipeline converter.

16. The apparatus of claim 15, wherein the MDAC means comprises a sampling capacitor means and a feedback capacitor means, wherein the sampling capacitor means has a value corresponding to $C_S$ and the feedback capacitor means has a value corresponding to $C_F$, the transfer curve comprising:

$$V_{OUT1} = \left(1 + \frac{C_S}{C_F}\right) \cdot V_{SHA} + 1,$$

when $V_{IN}$ is evaluated as less than a first predetermined threshold;

$$V_{OUT1} = \left(1 + \frac{C_S}{C_F}\right) \cdot V_{SHA},$$

when $V_{IN}$ is evaluated as greater than a second predetermined threshold; and $$V_{OUT1} = \left(\frac{C_S}{C_F}\right) \cdot V_{SHA},$$

when $V_{IN}$ is evaluated as between the first and second predetermined thresholds.

17. The apparatus of claim 16, wherein the first predetermined threshold corresponds to −VREF/4 and the second predetermined threshold corresponds to +VREF/4.

18. A method for converting an analog input signal to a digital code in the first stage of a pipeline converter, the method comprising:
- sampling the analog input signal during ($V_{IN}$) a first operating phase with a SHA circuit to provide a sampled signal ($V_{SHA}$) after the first operating phase;
- evaluating the analog input signal ($V_{IN}$) during the first operating phase with an evaluator circuit to provide a digital code after the first operating phase;
- selecting a reference voltage ($V_{REF}$) from a reference circuit in response to the digital code before a second operating phase;
- sampling the sampled signal during the second operating phase with a sampling capacitor ($C_S$) in an MDAC circuit;
- sampling the selected reference voltage ($V_{REF}$) during the second operating phase with a feedback capacitor ($C_F$) in the MDAC circuit; and
- configuring the sampling capacitor, the feedback capacitor, and an amplifier in a feedback loop to adjust an output voltage ($V_{OUT1}$) during the first operating phase to provide enhanced DNL performance in the pipeline converter.

19. The method of claim 18, wherein the first operating phase corresponds to a sampling phase, and the second operating phase corresponds to an amplification phase in the pipeline converter.

20. The method of claim 18, wherein a transfer function associated with the output voltage comprises:

$$V_{OUT1} = \left(1 + \frac{C_S}{C_F}\right) \cdot V_{SHA} + 1,$$

when $V_{IN}$ is evaluated as less than a first predetermined threshold;

$$V_{OUT1} = \left(1 + \frac{C_S}{C_F}\right) \cdot V_{SHA},$$

when $V_{IN}$ is evaluated as greater than a second predetermined threshold; and $$V_{OUT1} = \left(\frac{C_S}{C_F}\right) \cdot V_{SHA},$$

when $V_{IN}$ is evaluated as between the first and second predetermined thresholds.

* * * * *